Dec. 8, 1964 L. MAYON ETAL 3,160,455

PRINTED CIRCUIT BOARDS AND CONNECTORS THEREFOR

Filed May 16, 1961

*INVENTORS.*
LEON MAYON
JOSEPH A. ZANG, JR.

BY Samuel Kane

ATTORNEY

United States Patent Office 3,160,455 Patented Dec. 8, 1964

3,160,455
PRINTED CIRCUIT BOARDS AND CONNECTORS THEREFOR

Leon Mayon, Philadelphia, and Joseph A. Zang, Jr., Newtown Square, Pa., assignors to Burroughs Corporation, Detroit, Mich., a corporation of Michigan Filed May 16, 1961, Ser. No. 110,368
7 Claims. (Cl. 339—17)

This invention relates generally to electrical panel connections and more particularly to printed circuit boards and the like and multiple contact connectors for use with such boards.

A principal object of the invention is to increase the capacity of a printed circuit or the like board for making external electrical connections.

Another object of the invention is to increase the capacity of a printed circuit or the like board for making external electrical connections without significantly reducing the component-carrying surfaces of the board.

A further object of the invention is to increase the number of contact elements along a plug-in margin of a printed circuit or the like board without substantially increasing the initial insertion force required for plugging the board into a multiple contact connector.

Another object of the invention is to provide means for attaching a number of multiple contact connectors, arranged in tandem, to a mounting panel or the like, such that the contact forces in all connectors will be equally distributed upon plug-in insertion of a printed circuit or the like board into the connectors.

In accordance with the above objects and first considered briefly in its broad aspects, the invention comprises a printed circuit or the like board provided with multiple groups of terminal contact elements on a plug-in margin of the board. A multiple contact connector for plug-in reception of the board margin is provided with a corresponding number of groups of contacts for making electrical connections with the terminal contact elements on the board margin. A variation of the connector takes the form of a multiple-part connector, in which case equal distribution of contact forces is obtained, upon insertion of a printed circuit or the like board into the connector parts, by providing for relative orientation between the parts to bring their contacts in line.

The invention will be more clearly understood when the following detailed description of specific embodiments thereof is read in conjunction with the accompanying drawings in which.

Figure 1:
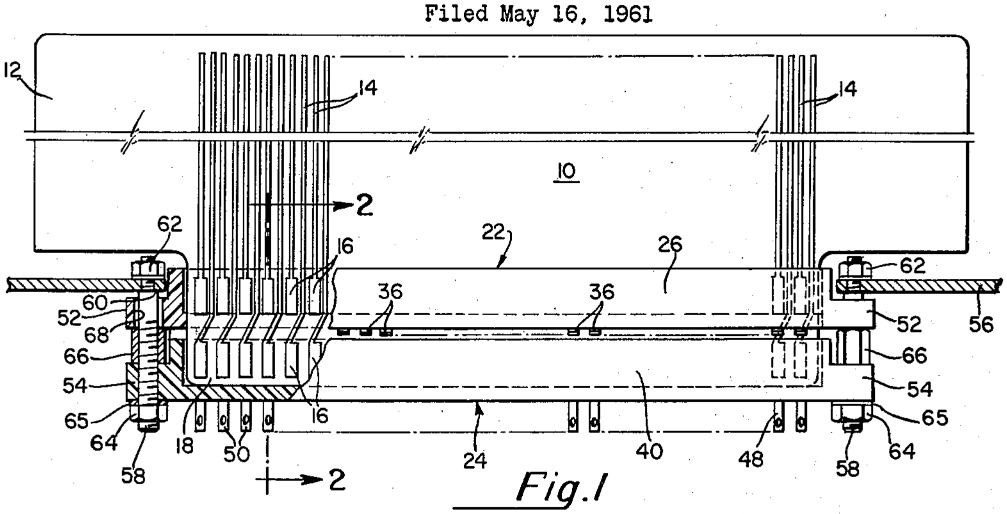
FIG. 1 is a front view, partially in section, of an electrical assembly embodying one form of printed circuit board and one form of connector, both constructed in accordance with the invention.
Figure 2:
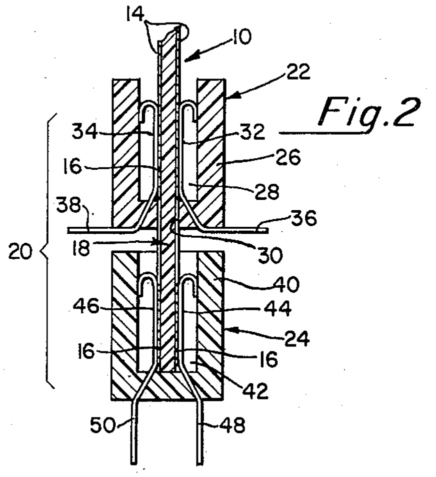
FIG. 2 is a sectional view, on an enlarged scale, taken along line 2—2 of FIGURE 1.

Turning now to the detailed description, and first with reference to FIGURES 1 and 2 in the drawings, a printed circuit board 10 comprises a panel or board 12 of electrically insulating material, and electrical circuits or conductors 14 on the front face of the panel which terminate in contact elements 16 arranged in parallel groups or rows on a projecting margin 18 of the board 10. For purposes of illustration, a like group of electrical circuits or conductors 14 and rows of contact elements 16 are similarly situated on the rear face of the panel 12, however, only one face of the panel may be used for conductors 14 and contact elements 16, if desired, in which case the multiple contact connectors, presently to be described, would be constructed to suit.

In one of its forms, the multiple contact connector is constructed as a two-part connector 20 comprising an upper connector 22 and a lower connector 24. The upper connector 22 comprises an elongated block 26 of electrically insulating material provided with an elongated opening or cavity 28 which opens externally at its lower end through an elongated slot 30, of greater width than the thickness of the printed circuit board 10, to enable the margin 18 of the board to be plugged into the lower connector 24 through the upper connector 22.

Two confronting rows of contacts 32 and 34 are arranged in the opening 28 and suitably spaced apart to provide the desired degree of contact force on the upper rows of contact elements 16, as is well understood. The contacts 32 and the contacts 34 are spaced apart in their respective rows along the longitudinal dimension of the block 26 to correspond in position with the contact elements in the upper rows of contact elements 16. At their lower regions, the contacts 32 and 34 extend through suitable openings in the block 26 and are bent laterally to provide terminals 36 and 38, respectively, for connecting wires or other elements of associated circuitry.

The lower connector 24 is somewhat similar to the upper connector 22 and consists of an elongated block 40 of electrically insulating material provided with an elongated opening or cavity 42 in which are similarly positioned spaced-apart rows of contacts 44 and 46. The contacts 44 and 46 are spaced apart in their respective rows to correspond in position with the contact elements in the lower rows of contact elements 16. The contacts 44 and 46 extend through suitable openings in the block 40 to provide depending terminals 48 and 50, respectively, for connecting wires or other elements of associated circuitry.

From the foregoing description, it will now be apparent that the invention provides multiple rows of contact elements 16 along the same margin 18 of the board 10, without significantly taking up any additional surface of the board, thereby increasing the capacity of the board for making external circuit connections, and providing, further, a novel connector means 20 for use with the board for making such connections. It will also be perceived, from FIG. 2, that when the margin 18 of the printed circuit board 10 is plugged downwardly successively into the connectors 22 and 24, the initial insertion forces required will not be substantially increased over what would be required if there were only one connector 22 or 24.

The connectors 22 and 24 are similarly provided with mounting pads 52 and 54, respectively, at their ends for attaching the connectors to an associated structure, such as a panel 56. Passing through the pads 52 and 54 are studs 58 each provided with a shoulder 60 which abuts the lower face of the panel 56. Nuts 62 secure the studs 58 rigidly to the panel 56. The pads 54 are held rigidly between locknuts 64, washers 65, and locknuts 66, so that the lower connector 24 is held rigidly to the panel 56. The openings 68 in the pads 52, through which the studs 58 extend, are slightly larger in size or diameter than the studs to allow the upper connector 22 to shift somewhat laterally. Also, the height of the pads 52 is somewhat less than the distance between the lower face of the panel 56 and the upper end faces of the nuts 66, so that the upper connector 22 may also shift somewhat vertically. Accordingly, when the printed circuit board 10 is plugged into the connectors 22 and 24 in a downward direction, as may be perceived from FIG. 1, the upper connector 22 will float or orient itself into line with the lower connector 24, thereby to distribute equally the contact forces on the contact elements 16 on both faces of the margin 18.

Figure 3:
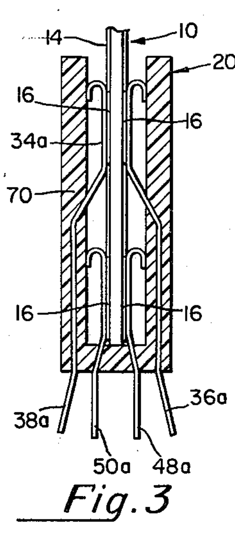
FIG. 3 illustrates a modification of the connector for the printed circuit board of FIGURE 1.

FIG. 3 shows a modification 20*a* of the connector in which the connector takes the form of a single block 70 of electrically insulating material, and the terminals 36*a* and 38*a* extend from the same side of the connector as the terminals 48*a* and 50*a*.

Figure 4:
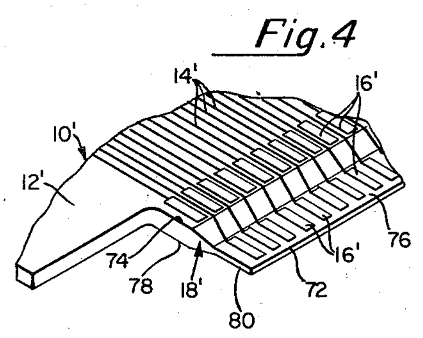
FIG. 4 is an isometric view of a fragment of a modification of the printed circuit board.

FIG. 4 shows a modification 10′ of the printed circuit board in which the plug-in margin 18′ is provided with a central portion 72, of lesser thickness than the panel 12′, providing upper and lower contact levels 74 and 76, tor arranged for plug-in receiption of the margin 18′ of the which are disposed terminating contact elements 16′. The lower or bottom surface of the margin 18′ is similarly provided with levels 78 and 80, opposite to the levels 74 and 76, respectively, on which are also disposed terminating contact elements 16′.

Figure 5:
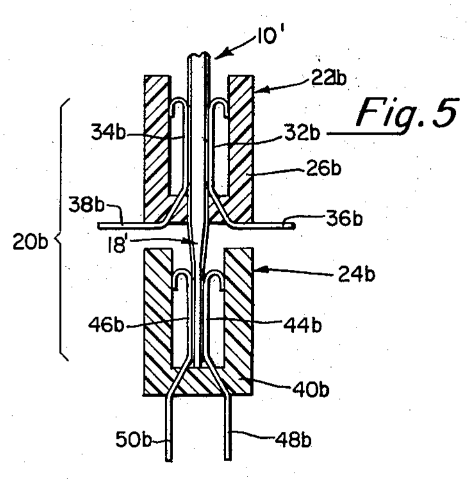
FIG. 5 shows a connector similar to the one shown in FIGURES 1 and 2 but with certain of its contacts positioned differently to accommodate the printed circuit board shown in FIGURE 4.

FIG. 5 shows another modification 20*b* of the connector arranged for plug-in reception of the margin 18′ of the printed circuit board 10′. In this modification 20*b*, the rows of contacts 44*b* and 46*b* are spaced closer together than the rows of contacts 32*b* and 34*b* to accommodate the lesser thickness of the margin 18′ at the contact levels 76 and 80. Since the contact rows 32*b* and 34*b* are normally spaced apart a distance greater than the thickness of the central portion 72, plug-in insertion of the printed circuit board 10′ into the connector 20*b* is accomplished without short-circuiting the contacts 32*b* and 34*b* by the contact elements 16′ on the leading contact levels 76 and 80.

Figure 6:
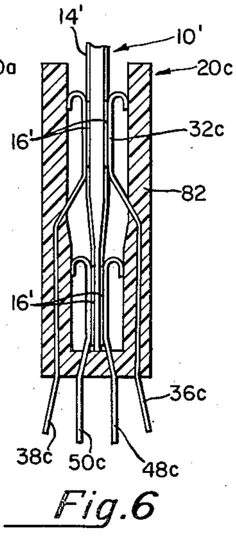
FIG. 6 shows a connector similar to the one shown in FIGURE 3 but with certain of its contacts positioned differently to accommodate the printed circuit board shown in FIGURE 4.

FIG. 6 shows another modification 20*c* of the connector, similar to the modification 20*a*, for accommodating the printed circuit board 10′. In this modification 20*c*, the connector takes the form of a single block 82 of electrically insulating material, and the terminals 36*c* and 38*c* extend from the same side of the connector as the terminals 48*c* and 50*c*.

From the foregoing description, it will now be apparent that the invention provides means for electrically connecting and mounting printed circuit and the like boards and for increasing the capacity and flexibility of such boards for making external connections.

While there have been disclosed various structures exemplary of the principles of the invention, it is to be understood that these are but specific embodiments thereof, and that the invention is capable of being constructed in a variety of shapes, sizes, modifications and arrangements without departing from it true spirit and scope. Accordingly, it is to be understood that the invention is not to be limited by the specific structures disclosed, but only by the subjoined claims.

What is claimed is:

1. A multiple contact connection means for plug-in reception of a printed circuit board having rows of contact elements arranged in tandem along a margin of the board comprising, two separate relatively movable multiple contact connector blocks arranged in tandem, each said connector block having at least one row of contacts for contacting one of said rows of contact elements, the forward one of said connector block in the direction of insertion of said board being open at its rearward end to permit said margin of the board to the inserted through said forward connector block into the other connector block.

2. A printed circuit board for plung-in insertion into a multiple contact connector having rows of contacts, one row arranged rearwardly of another row in the direction of insertion of the board, said board comprising a panel of electrically insulating material carrying a plurality of circuits each terminating in a printed circuit contact element along a margin of the board, said contact elements being arranged in pairs of rows at said margin with the rows of each pair being opposite each other and on opposite sides of the board corresponding in position with the rows of contacts of said multiple contact connector for sliding electrical contact therewith.

3. A pluggable printed circuit board comprising, a flat panel of electrically insulating material having a margin provided with different thicknesses, each thickness of said margin providing at least one contact level, a plurality of printed circuit contact elements arranged in parallel rows normal to the direction in which the board is to be plugged, each row on one of said contact levels, and a plurality of circuits carried by said panel each terminating in one of said contact elements.

4. The combination comprising, a pluggable printed circuit board having a plurality of electrical conductors, said conductors terminating in printed circuit contact elements on both sides of the same margin of the board, said contact elements being arranged in parallel rows on each side of the margin normal to the direction in which the board is to be plugged, said rows of contact elements being arranged in pairs with the rows of each pair being opposite each other and on opposite sides of said margin, and a connector provided with an opening for plug-in reception of said margin, said opening having a plurality of rows of contacts arranged in pairs of rows with the rows of each pair being opposite each other and an opposite sides of said opening, each said pair of rows of contacts for slidingly contacting one of said pairs of rows of contact elements and the rows in one of said pairs of rows of contacts being laterally movable in the same direction normal to the plane of said board to orient themselves relative to another pair of said rows of contacts.

5. The combination comprising, a panel of electrically insulating material having a portion of reduced thickness at one of its margins, electrical conductors on said panel terminating in printed circuit contact elements on the panel at said margin, said contact elements being arranged in two pairs of rows, a pair of rows on the portion of reduced thickness, and a pair of rows on the unreduced portion of the panel, the rows of each pair being on opposite sides of the panel, a connector having an opening for plug-in reception of said margin and having corresponding rows of contacts arranged in two pairs of rows of contacts each pair for contacting one of said pairs of rows of contact elements, the rows of each pair of rows of contacts being spaced apart and opposite each other and on opposite sides of said opening and one of said pairs of rows of contacts being bodily movable relative to the other said pair of rows of contacts, and means for attaching the connector to an associated structure in such manner that, when the panel margin is plugged thereinto, said movable pair of rows of contacts will shift to orient themselves into line with said other pair of rows of contacts whereby the contact forces will distribute equally on the rows of contact elements of each pair of rows.

6. A multiple contact connector for a printed circuit board comprising, first and second parts of electrically insulating material, said parts each provided with a transverse opening for plug-in reception of said board, a first pair of spaced apart rows of contacts in the opening of said first part and opposite each other for engaging two rows of printed circuit contact elements on opposite sides of said printed circuit board, and a second pair of spaced apart rows of contacts in the opening of said second part substantially in line with said first pair of spaced apart rows of contacts and opposite each other for engaging two rows of printed circuit contact elements on opposite sides of said printed circuit board, said parts being relatively movable in response to insertion of said board therein to orient their rows of contacts into line.

7. The combination comprising, a panel of electrically insulating material having a portion of reduced thickness at one of its margins, electrical conductors on said panel terminating in printed circuit contact elements on the panel at said margin, said contact elements being arranged in pairs of rows, a pair of rows on the portion of reduced thickness, and a pair of rows on the unreduced portion of the panel, the rows of each pair being on opposite sides of the panel, and a connector for plug-in reception of said margin and having corresponding rows of contacts, each said row of contacts arranged for contacting one of said rows of contact elements.

References Cited in the file of this patent

UNITED STATES PATENTS

| | | |
|---|---|---|
| 2,220,158 | Kohler | Nov. 5, 1940 |
| 2,870,400 | Hickok | Jan. 20, 1959 |
| 2,929,042 | Guttridge et al. | Mar. 15, 1960 |
| 3,040,289 | Wicks | June 19, 1962 |
| 3,086,096 | McGee | Apr. 16, 1963 |